United States Patent
Kim et al.

(10) Patent No.: US 9,632,487 B2
(45) Date of Patent: Apr. 25, 2017

(54) ORGANIC LIGHT EMITTING DISPLAY DEVICE

(71) Applicant: LG DISPLAY CO., LTD., Seoul (KR)

(72) Inventors: Miso Kim, Paju-si (KR); Taejoon Ahn, Paju-si (KR); Sangmoo Song, Goyang-si (KR); Heekwang Kang, Goyang-si (KR); Hoyoung Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/222,684

(22) Filed: Jul. 28, 2016

(65) Prior Publication Data

US 2017/0031323 A1 Feb. 2, 2017

(30) Foreign Application Priority Data

Jul. 29, 2015 (KR) ........................ 10-2015-0107449

(51) Int. Cl.
*H01J 17/49* (2012.01)
*G04G 9/10* (2006.01)
*H01L 27/32* (2006.01)
*H01L 27/12* (2006.01)

(52) U.S. Cl.
CPC ........... *G04G 9/10* (2013.01); *H01L 27/3246* (2013.01); *H01L 27/3258* (2013.01); *H01L 27/3262* (2013.01); *H01L 27/3276* (2013.01); *H01L 27/124* (2013.01); *H01L 27/1248* (2013.01)

(58) Field of Classification Search
CPC .. H01J 11/18; H01J 17/49; H01J 61/30; H01J 61/305; G01J 1/4257; G01J 3/443; G09G 2300/0426; G09G 2300/0439; G09G 2300/08; G09G 3/288
USPC ........ 313/485, 582, 585; 315/169.3; 445/24, 445/33
See application file for complete search history.

(56) References Cited

U.S. PATENT DOCUMENTS

| 5,452,511 A | * | 9/1995 | Chang | ............... H01L 23/49537 257/E23.042 |
| 5,454,905 A | * | 10/1995 | Fogelson | ................... C23F 1/02 216/14 |
| 5,517,056 A | * | 5/1996 | Bigler | ................... H01L 21/565 257/666 |
| 6,150,709 A | * | 11/2000 | Shin | ................... H01L 23/3114 257/666 |

(Continued)

*Primary Examiner* — William F Kraig
*Assistant Examiner* — Edward Chin
(74) *Attorney, Agent, or Firm* — Birch, Stewart, Kolasch & Birch, LLP

(57) ABSTRACT

Discussed is an organic light emitting display device including a substrate having a display area in which a plurality of plurality pixels are disposed, a non-display area outside of the display area, and at least one open hole area defined between the plurality of pixels, and a stacked layer structure disposed on the substrate and defining the plurality of pixels in the display area, the stacked layer structure including at least one organic layer, wherein the at least one open hole area includes at least one open hole penetrating through the substrate and at least one partition disposed along a circumference of the at least one open hole between the at least one open hole and the plurality of pixels adjacent thereto to separate the at least one organic layer from a corresponding layer that extends to the at least one open hole.

20 Claims, 14 Drawing Sheets

(56) References Cited

U.S. PATENT DOCUMENTS

| | | | | |
|---|---|---|---|---|
| 6,348,726 B1* | 2/2002 | Bayan | ............... | H01L 23/3107 257/666 |
| 6,861,734 B2* | 3/2005 | Minamio | ............ | H01L 21/4842 257/666 |
| 7,193,298 B2* | 3/2007 | Hong | ............... | H01L 23/49541 257/666 |
| 7,808,084 B1* | 10/2010 | Lee | ................. | H01L 23/49548 257/666 |
| 7,928,542 B2* | 4/2011 | Lee | ................... | H01L 23/3107 257/666 |
| 7,986,032 B2* | 7/2011 | Chow | ............... | H01L 23/3107 257/666 |
| 8,184,453 B1* | 5/2012 | Kim | .................. | H01L 21/4828 361/768 |
| 8,188,579 B1* | 5/2012 | Kim | ................. | H01L 23/49503 257/666 |
| 2003/0168719 A1* | 9/2003 | Cheng | ............... | H01L 23/3107 257/666 |
| 2008/0122048 A1* | 5/2008 | Chan | ................. | H01L 21/4842 257/666 |
| 2008/0283980 A1* | 11/2008 | Gao | ................. | H01L 23/49541 257/670 |
| 2011/0049685 A1* | 3/2011 | Park | ................. | H01L 23/3107 257/660 |
| 2011/0108963 A1* | 5/2011 | Balakrishnan | ...... | H01L 23/3107 257/670 |
| 2011/0227205 A1* | 9/2011 | Lu | ................... | H01L 23/49537 257/670 |

\* cited by examiner (a)

(b)

(c)

(a)

(b)

(a)

(b)

ORGANIC LIGHT EMITTING DISPLAY DEVICE

This application claims the priority benefit of Korean Patent Application No. 10-2015-0107449 filed on Jul. 29, 2015 which is incorporated herein by reference for all purposes as if fully set forth herein.

BACKGROUND OF THE INVENTION

Field of the Invention

The present disclosure relates to an organic light emitting display device having an open hole penetrating through a display area.

Discussion of the Related Art

Various flat display devices reduced in weight and volume, compared with cathode ray tubes (CRTs) heavy in weight and large in volume, have been developed. Flat display devices include a liquid crystal display (LCD), a field emission display (FED), a plasma display panel (PDP), an organic light emitting display device, and the like.

Display devices, which are thin and lightweight, are commonly used as display means in mobile communication terminals or portable information processing devices. In particular, portable or mobile devices increasingly require display panels which are thinner and lighter and consume less power. Especially, an organic light emitting display device, which is self-luminous, advantageously has high luminance, a wide viewing angle, an excellent contrast ratio, and a fast response speed.

Liquid crystal display devices or plasma display devices have limitations in developing a self-luminous element having high flexibility and elasticity, and thus, they are limited to be applied as flexible display devices. In contrast, an organic light emitting display device is formed using an organic thin film, which has come into prominence as an optimal material that can be applied to a flexible display device using flexibility and elasticity, features of an organic thin film.

However, such an organic light emitting display device is vulnerable to introduction of moisture and oxygen from outside. Due to the problem, organic light emitting display devices have many restrictions in being modified to various forms.

SUMMARY OF THE INVENTION

An aspect of the present disclosure provides an organic light emitting display device in which a partition is formed along the circumference of an open hole to block an introduction of moisture and oxygen and propagation of cracks.

An organic light emitting display device according to an embodiment of the present invention includes a substrate having a display area in which a plurality of pixels are disposed, a non-display area outside of the display area, and at least one open hole area defined between the pixels, and a stacked layer structure disposed on the substrate and defining the plurality of pixels in the display area, the stacked layer structure including at least one organic layer, wherein the open hole area includes at least one open hole penetrating through the substrate and at least one partition disposed along a circumference of the open hole between the open hole and the pixels adjacent thereto to separate the at least one organic layer from a corresponding layer that extends to the open hole.

An organic light emitting display device according to an embodiment of the present invention includes a substrate having a display area in which a plurality of pixels are disposed, a non-display area outside of the display area, and at least one open hole area defined between the pixels, and a stacked layer structure disposed on the substrate and defining the plurality of pixels in the display area, the stacked layer structure including at least one organic layer, wherein the open hole area comprises at least one open hole penetrating through the substrate, and a blocking pattern disposed along a circumference of the open hole to block an introduction path of moisture and oxygen and a propagation path of cracks from spreading to the pixels adjacent to the open hole by way of the at least one organic layer which extends to the open hole.

BRIEF DESCRIPTION OF THE DRAWINGS

The accompanying drawings, which are included to provide a further understanding of the invention and are incorporated in and constitute a part of this specification, illustrate embodiments of the invention and together with the description explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention. In describing various embodiments, the same components will be representatively described in a first embodiment and may be omitted in other embodiments.

Hereinafter, a problem arising when an open hole is formed in a structure of an organic light emitting display device according to the related art will be described before describing an organic light emitting display device according to an embodiment of the present invention. The organic light emitting display device may be modified to various forms as an application field thereof is diversified. As part thereof, an open hole penetrating through an inner side of the organic light emitting display device is required to be processed. When an open hole is provided, the organic light emitting display device according to the related art is difficult to block moisture and oxygen that may be introduced through the open hole and propagation of cracks formed due to an external factor to the interior of the device.

Figure 1:
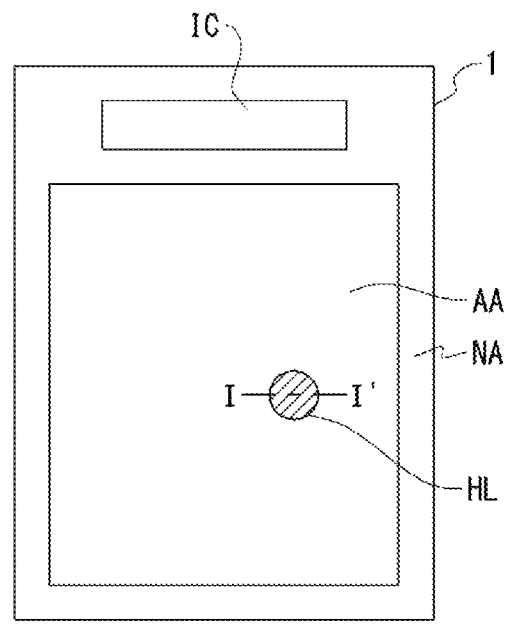
FIG. 1 is a plan view schematically illustrating a configuration of a related art organic light emitting display device having an open hole.
Figure 2:
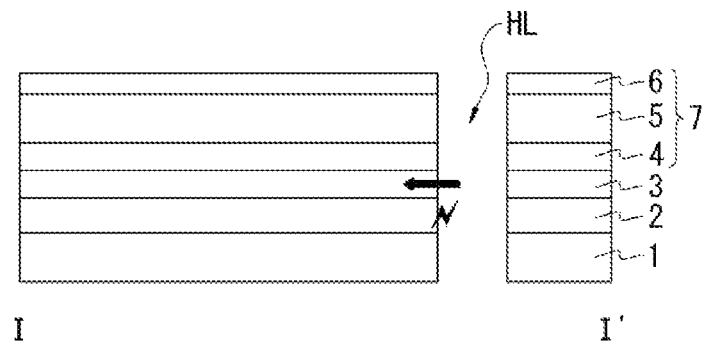
FIG. 2 is a cross-sectional view of the organic light emitting display device illustrated in FIG. 1, taken along line I-I'.

A problem arising when an open hole is formed in a structure of the an organic light emitting display device according to the related art will be described with reference to FIGS. 1 and 2. FIG. 1 is a plan view schematically illustrating a configuration in which an open hole is formed in an organic light emitting display device according to a related art. FIG. 2 is a cross-sectional view of the organic light emitting display device illustrated in FIG. 1, taken along line I-I'.

The related art organic light emitting display device includes a substrate 1 in which a display area AA displaying an image and a non-display area NA surrounding the display area AA are defined. The display area AA includes a thin film transistor (TFT) and an organic light emitting diode (OLED) 3 driven by the TFT 2. These elements 2 and 3 are very vulnerable to external oxygen and moisture. Internally introduced oxygen and moisture cause shrinkage of a light emission area due to a degradation of an organic substance to shorten lifespan of the elements 2 and 3, and oxidize or corrode the elements 2 and 3 to generate current leakage and short circuit. Thus, a protective layer 7 protecting the elements 2 and 3 from the introduction of moisture and oxygen is essential.

The protective layer 7 includes a first inorganic film 4 formed on the entire surface of the substrate 1, an organic film 5 formed on the first inorganic film 4 and formed of an organic material such as polymer, and a second inorganic film 6 formed on the entire surface of the first substrate 1 including the organic film 5 and blocking an introduction of moisture and oxygen. The first inorganic film 4 and the second inorganic film 6 are stacked on the substrate 1 to cover both the display area AA and the non-display area NA.

In the related art organic light emitting display device, an open hole HL penetrating through an interior of the display area AA may be formed. The open hole HL penetrates through the display area AA including several elements. Thus, the elements provided within the display area AA are exposed to oxygen and moisture introduced from the outside in an area adjacent to the open hole HL. Further, fine cracks may be generated due to an external factor in the organic light emitting display device. The generated fine cracks propagate as is to the interior of the display device, causing a defective element. In addition, the moisture and oxygen introduced along the crack path may cause blur of a black dot and a black line.

In the related art organic light emitting display device, the introduction of moisture and oxygen in the area opened by the open hole HL are not blocked and propagation of cracks is not blocked. Thus, when the open hole HL is formed, the related art organic light emitting display device lacks ability to prevent a defective element, resulting in a degradation of reliability and stability of a product.

Figure 3:
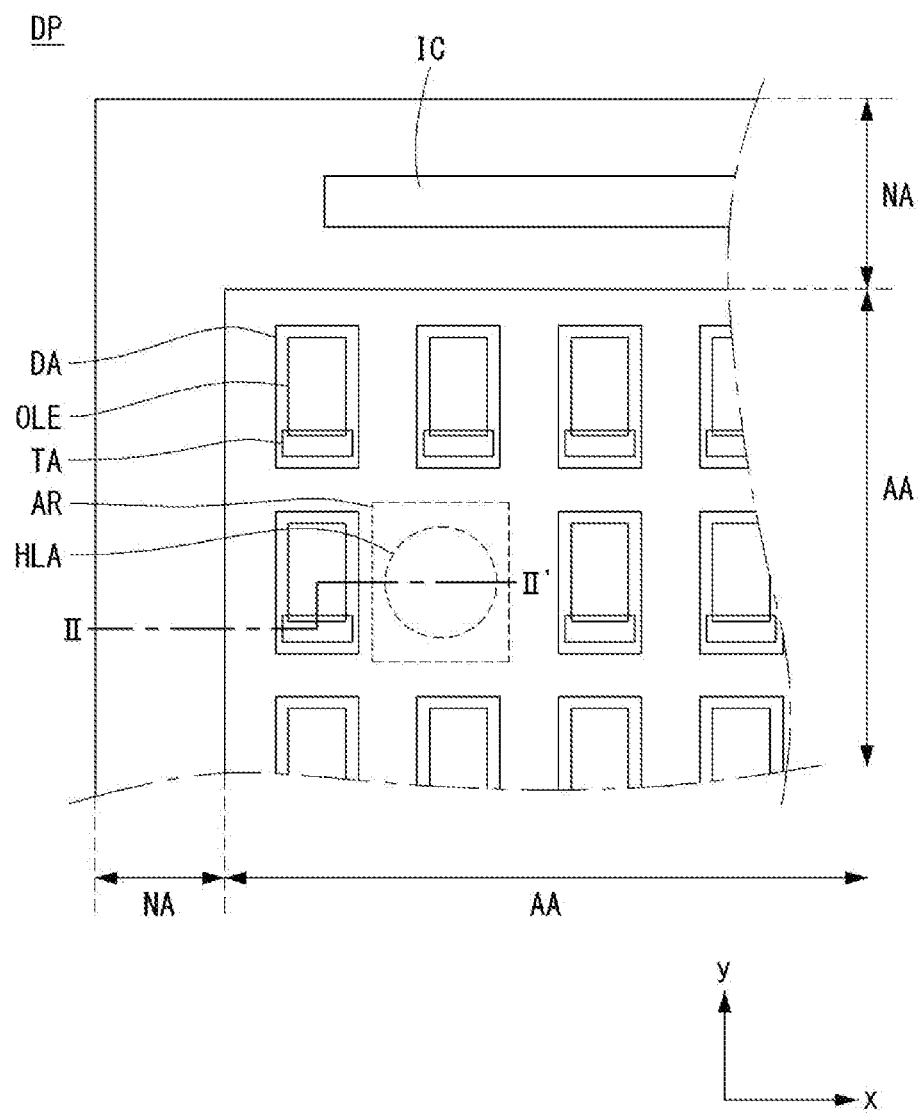
FIG. 3 is a plan view illustrating a schematic structure of an organic light emitting display device according to an embodiment of the present invention.
Figure 4:
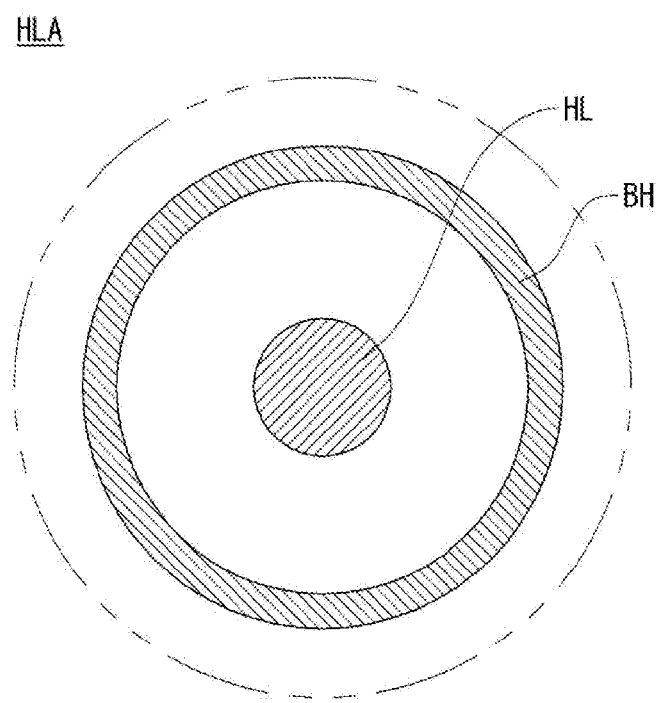
FIGS. 4 and 5 are enlarged views of an open hole area in FIG. 3.
Figure 5:
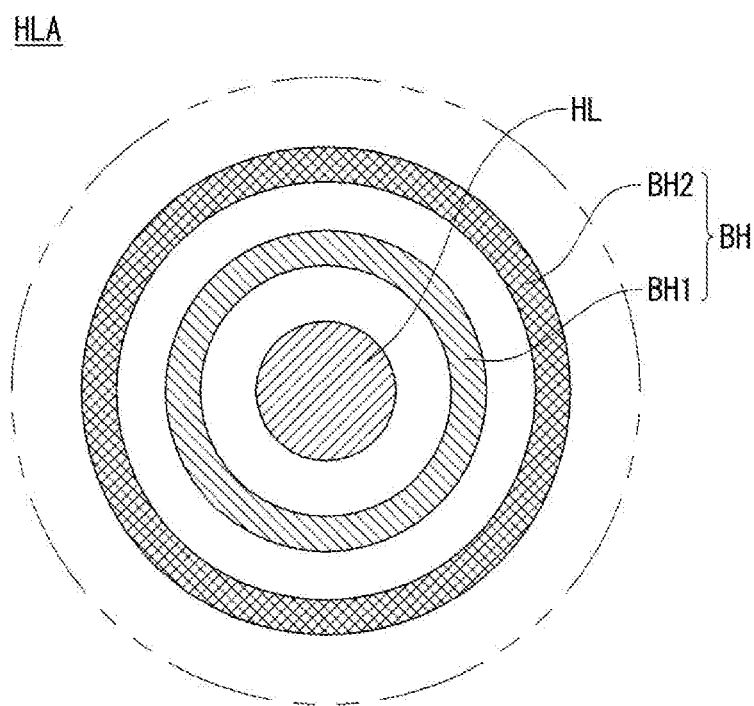
Figure 6:
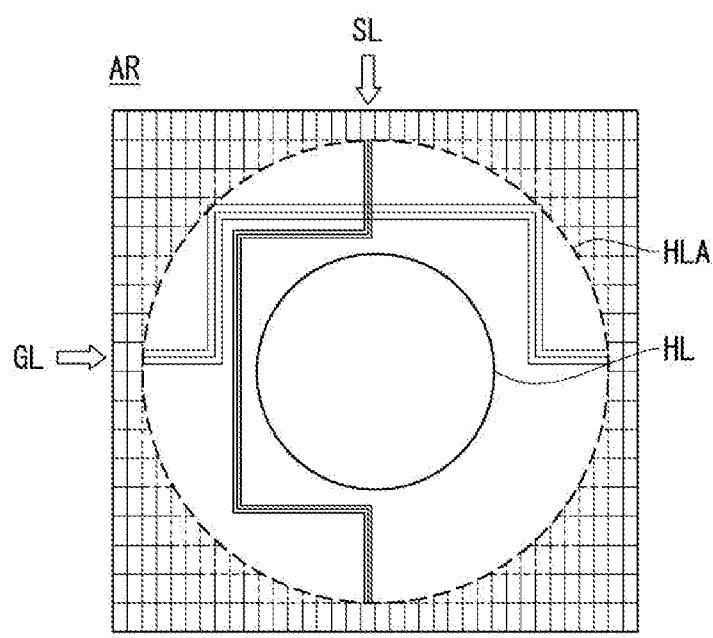
FIG. 6 is an enlarged view of an area 'AR' to explain formation positions of a gate line and a data line disposed to be close to the open hole of FIG. 3.

Hereinafter, a structure of an organic light emitting display device according to an embodiment of the present invention will be described. FIG. 3 is a plan view illustrating a schematic structure of an organic light emitting display device according to an embodiment of the present invention. FIGS. 4 and 5 are enlarged views of an open hole area in FIG. 3. FIG. 6 is an enlarged view of an area 'AR' to explain formation positions of a gate line and a data line disposed to be close to the open hole of FIG. 3.

The organic light emitting display device according to an embodiment of the present invention includes a substrate SUB divided into a display area AA displaying image information and a non-display area NA in which several elements for driving the display area AA are disposed. The substrate SUB may be formed of glass or a plastic material having flexible characteristics. For example, the substrate SUB may be formed of a material such as polyimide (PI), polyethylene terephthalate (PET), polyethylene naphthalate (PEN), polycarbonate (PC), polyethersulfone (PES), polyarylate (PAR), polysulfone (PSF), or ciclic-olefin copolymer (COC).

Pixels PA are disposed in a matrix form in the display area AA. Each of the pixels PA includes core components of the organic light emitting display device, that is, an OLED OLE and thin film transistors (TFTs) for driving the OLED OLE. The TFTs may be formed in a TFT area TA defined at one portion of the pixel PA.

At least one open hole area HLA is defined in the display area. The open hole area HLA is defined between pixels. The open hole area HLA includes an open hole HL and a partition BH (or a blocking pattern). The partition BH may be formed of the same material as the substrate SUB.

The open hole HL refers to a hole penetrating through the substrate SUB. At least one open hole HL may be provided in a single open hole area HLA.

The partition BH is provided on the substrate SUB along the circumference of the open hole HL. The partition BH is formed between the open hole HL and pixels adjacent thereto. At least one partition BH may be provided along the circumference of the open hole HL. The at least one partition BH may include a first partition BH1 and a second partition BH2. The first partition BH1 is spaced apart from the second partition BH2 at a predetermined interval.

As described hereinafter, in the organic light emitting display device, various elements for driving the OLED are provided and stacked films are patterned so as to be stacked as several layers. Some of the stacked layers are required to be deposited on the entire surface of the substrate SUB due to a problem that may occur during the manufacturing process. Further, some other portions of the stacked layers may be difficult to micro-pattern. These layers become an introduction path of oxygen and moisture and/or a propagation path of fine cracks when the open hole HL is formed. The partition BH separates these layers from corresponding layers that extend to the open hole HL to block the introduction path of oxygen and moisture and propagation path of fine cracks from effecting the respective layers that are outside the open hole area HLA. In addition, the partition BH may allow layers required to be deposited on the entire surface or difficult to fine-pattern to be formed along a tapered surface of the partition BH to lengthen the introduction path of oxygen and moisture and the propagation path of fine cracks.

In the non-display area NA a pixel driving unit IC for driving the display area AA is provided. The pixel driving unit IC may include a data driving integrated circuit (or a data driver) for supplying a signal corresponding to image information to data lines SL and a gate driving integrated circuit (or a gate driver) for supplying a scan signal to gate lines GL. The gate line GL and the data line SL are disposed to cross each other, and demarcate pixels. The gate line GL is disposed to bypass the open hole HL. The data line SL is disposed to bypass the open hole HL.

Figure 7:
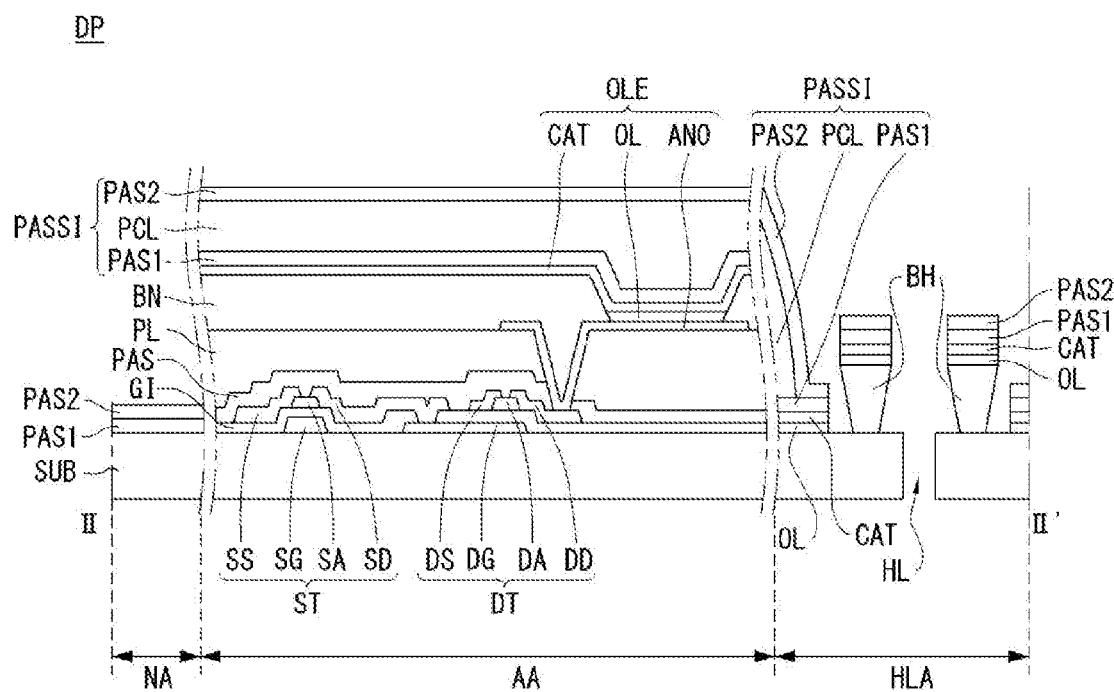
FIGS. 7 to 9 are cross-sectional views of the organic light emitting display device illustrated in FIG. 3, taken along line II-II', in which a stacked structure of the organic light emitting display device is illustrated.
Figure 8:
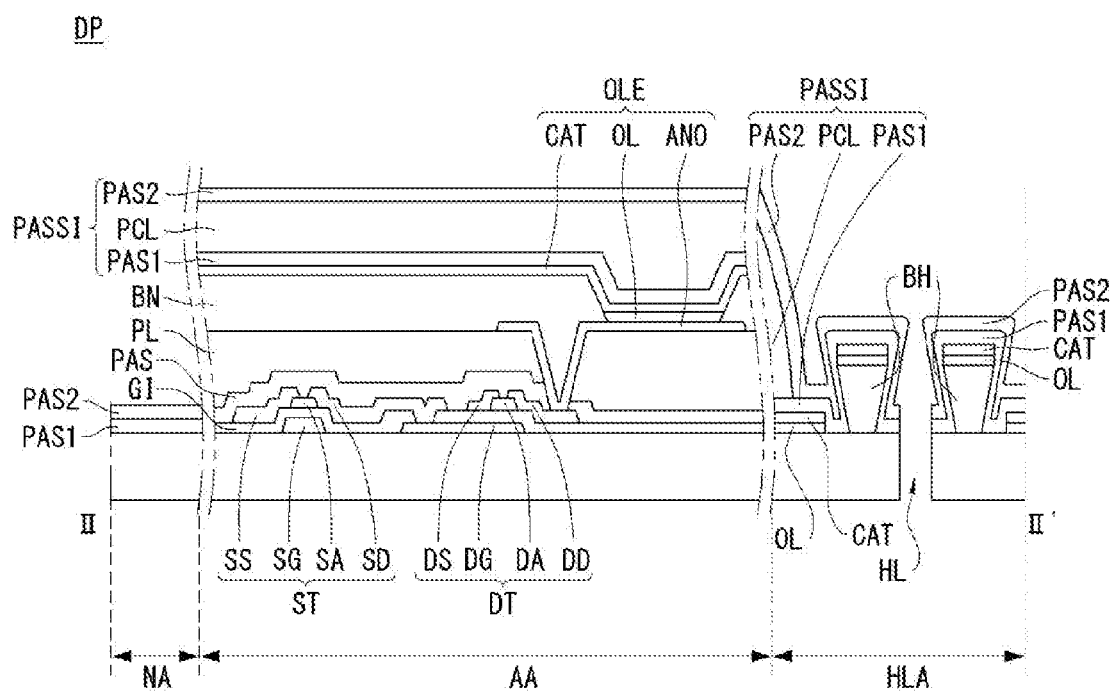
Figure 9:
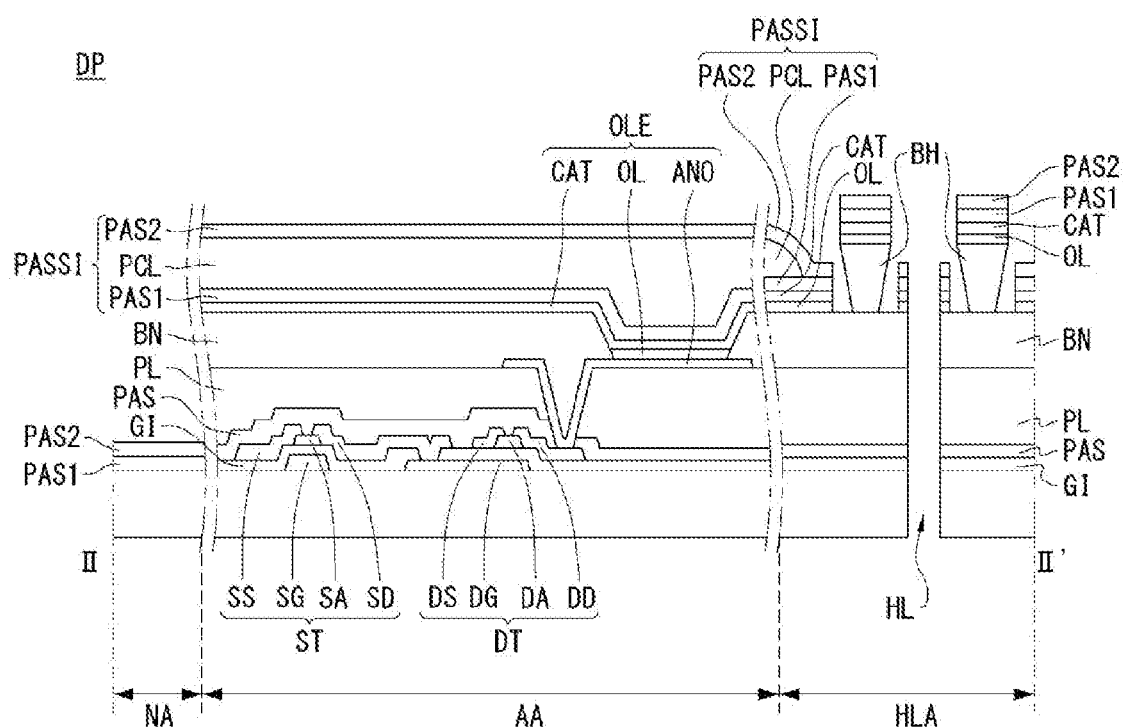

Hereinafter, an example of a stacked structure of the organic light emitting display device according to an embodiment of the present invention will be described. FIGS. 7 to 9 are cross-sectional views of the organic light emitting display device illustrated in FIG. 3, taken along line II-II', in which a stacked structure of the organic light emitting display device is illustrated.

The display area AA, the non-display area NA, and the open hole area HLA are defined on the substrate SUB. Pixels PA arranged in a matrix form are defined in the display area AA. An OLED (OLE) and TFTs ST and DT for driving the OLED (OLE), core components of the organic light emitting display device, are disposed in each of the pixels PA. The TFTs ST and DT may be formed in a TFT area TA defined at one portion of the pixel PA. The OLED (OLE) includes an anode electrode ANO, a cathode electrode CAT, and an organic emission layer OL interposed between the two electrodes.

In the TFT area TA of each pixel PA, a switching TFT ST and a driving TFT DT are formed. The switching TFT ST includes a switching gate electrode SG, a gate insulating film GI, a switching channel layer SA, a switching source electrode SS, and a switching drain electrode SD. Further, the driving TFT DT includes a driving gate electrode DG connected to the switching drain electrode SD, a gate insulating film GI, a driving channel layer DA, a driving source electrode DS, and a driving drain electrode DD. The driving TFT DT drives the OLED (OLE) of a pixel PA selected by the switching TFT ST. Structures of the TFTs ST and DT are not limited thereto. The structures of the TFTs ST and DT may include any structure as long as it can drive the organic light emitting display device, such as a top gate structure, a bottom gate structure, and a double gate structure. A passivation film PAS and a planarization film PL are continuously deposited on the TFTs ST and DT.

An anode electrode ANO is formed on the planarization film PL in each of the pixels such that the anode electrode ANO occupies only a predetermined portion of the pixel PA and is not in contact with an anode electrode ANO of an adjacent pixel PA. The anode electrode ANO is connected to the driving drain electrode DD of the driving TFT DT via a contact hole penetrating through the passivation film PAS and the planarization film PL.

A bank BN material is deposited on the anode electrode ANO. The bank BN material is patterned to form a bank BN exposing a great part of the anode electrode ANO.

A partition BH is formed in the open hole area HLA. The partition BH may have an inversely tapered shape. In order to form the partition BH having an inversely tapered shape, the partition BH may be formed as a negative PI (Polyimide). However, the present invention is not limited thereto. The partition BH is disposed to extend along the circumference of the open hole HL.

The open hole area HLA is an area in which an image is not implemented within the display area AA. In order to sufficiently secure an area in which an image is implemented, a scheme for reducing the open hole area HLA is required. Further, the partition BH may be disposed to be adjacent to the open hole HL. For example, the partition BH may be disposed to be spaced apart from the open hole HL by a distance as minimum as possible in terms of a manufacturing process. Here, because the planar area occupied by the open hole HL and the partition BH is reduced, the open hole area HLA may be relatively reduced.

An organic emission layer OL is formed on the anode electrode ANO exposed by the bank BN pattern. When an organic light emitting display device is based on a scheme of implementing red (R), green (G), and blue (B) colors, the organic emission layer OL is patterned using a fine metal mask (FMM). Thus, patterning may be performed except for the open hole area HLA. However, it may be difficult for R, G, and B pigments to be accurately applied to a desired region due to a problem that may occur during the manufacturing process, for example, a problem such as a mask alignment, and the like. When R, G, and B pigments extend up to the open hole area HLA due to the problem that occurs during the manufacturing process, the organic emission layer OL may extend up to the open hole area HLA. Here, the organic emission layer OL may be a transmission path of oxygen and moisture to degrade an internal element. When an organic light emitting display device is based on a scheme of implementing a color using white light and a color filter, a pigment is deposited on the entire surface. Thus, the organic emission layer OL is formed to extend up to the open hole area HLA. Here, the organic emission layer OL may become a transmission path of oxygen and moisture to degrade an internal element.

In the organic light emitting display device according to an embodiment of the present invention, the organic emission layer OL may be separated in the open hole area HLA by forming the partition BH. Thus, in the organic light emitting display device according to an embodiment of the present invention, introduction of oxygen and moisture or propagation of cracks along the organic emission layer OL in an area adjacent to the open hole HL is prevented in advance, enhancing reliability and stability of the display device.

A conductive material is coated on the bank BN where the organic emission layer OL is formed, to form a cathode electrode CAT. The cathode electrode CAT is deposited on the entire surface. Accordingly, the OLED (OLE) including the anode electrode ANO, the organic emission layer OL, and the cathode electrode CAT is formed.

The cathode electrode CAT may not be formed using an FMM due to restrictions in terms of a manufacturing process. Thus, because the cathode electrode CAT is formed using an open mask, it is deposited on the entire surface of the substrate SUB. In the organic light emitting display device according to an embodiment of the present invention, the cathode electrode CAT is separated in the open hole area HLA by forming the partition BH. Accordingly, in the organic light emitting display device according to an embodiment of the present invention, because introduction of oxygen or moisture or propagation of cracks along the cathode electrode CAT is prevented in advance, reliability and stability of the display device may be enhanced.

In order to protect the driving element such as the TFTs ST and DT and the light emitting element such as the OLED (OLE) from moisture and oxygen, a passivation layer PASSI is formed. The passivation layer PASSI includes a first inorganic film PAS1, an organic film PCL, and a second organic film PAS2. The first inorganic film PAS1 and the second inorganic film PAS2 are formed of a silicon oxide ($SiO_2$) or a silicon nitride ($SiN_x$), an inorganic insulating material. The organic film PCL is formed of an organic material such as a polymer and interposed between the first inorganic film PAS1 and the second inorganic film PAS2. To block introduction of moisture and oxygen, the second inorganic film PAS2 is formed to completely cover the organic film PCL. As illustrated in FIG. 7, the passivation layer PASSI includes the first inorganic film PAS1, the organic film PCL, and the second inorganic film PAS2, but the present invention is not limited thereto and any structure may be employed as long as it can protect an internal organic element from moisture and oxygen. That is, the passivation layer PASSI may include one or more inorganic films to block penetration of moisture and oxygen, and may have a stacked structure including inorganic films or a stacked structure including one or more inorganic films and organic films. When the passivation layer PASSI includes an organic film, an inorganic film formed on the organic film may be formed to cover the organic film. By forming the inorganic film to cover edges of the organic film, penetration of oxygen and moisture to an internal element along the organic film from the outside may be blocked in advance.

The first inorganic film PAS1 and the second inorganic film PAS2 of the passivation layer PASSI are formed on the entire surface of the substrate SUB to cover elements. That is, the inorganic films PAS1 and PAS2 are formed on the entire surface of the substrate SUB to cover all of the display area AA, the non-display area NA, and the open hole area HLA. The organic film PCL is patterned so as not to be formed in the open hole area HLA. However, the present invention is not limited thereto and the organic film PCL may be patterned such that it is formed to extend up to the open hole area HLA but does not overlap the partition BH. In order to pattern the organic film, a silk screen mask may be used or various methods such as a squeeze method or a printing method may be used.

In the organic light emitting display device according to an embodiment of the present invention, the inorganic film PAS1 and the inorganic film PAS2 may each be separated in the open hole area HLA by forming the partition BH. Accordingly, in the organic light emitting display device according to an embodiment of the present invention, introduction of moisture and oxygen and propagation of cracks along the inorganic films PAS1 and PAS2 in an area adjacent to the open hole HL may be blocked in advance, enhancing reliability and stability of the display device.

In order to separate layers from respective portions formed to extend to the open hole area HLA, the partition BH is formed to have a step higher than a height of the layers. For example, in order to separate each of the organic emission layer OL, the cathode electrode CAT, and the inorganic films PAS1 and PAS2, the partition 13H is formed to be higher than a height of the stacked organic emission layer OL, the cathode electrode CAT, and the inorganic films PAS1 and PAS2.

In order to completely separate the layers formed to extend to the open hole HL from corresponding layers outside the open hole area HLA, a process line may be formed above the partition BH. The process line is a cutting line formed by a laser cutting method, or the like. The process line is formed along a planar shape of the partition BH from an upper portion of the partition BH. In the organic light emitting display device according to an embodiment of the present disclosure, the layers formed on the partition BH may be separated by forming the process line. Accordingly, a path along which oxygen and moistures is introduced and/or a path along which cracks propagate may be blocked by the partition.

Hereinafter, another example of a stacked structure of the organic light emitting display device according to an embodiment of the present disclosure will be described with reference to FIG. 8. FIG. 8 is a cross-sectional view of the organic light emitting display device illustrated in FIG. 3, taken along line II-II', in which a stacked structure of the organic light emitting display device is illustrated. In describing another example of the stacked structure of the organic light emitting display device, the same contents as that of the descriptions of FIG. 7 may be omitted.

The first inorganic film PAS1 and the second inorganic film PAS2 of the passivation layer PASSI are formed on the entire surface of the substrate SUB to cover elements. That is, the inorganic films PAS1 and PAS2 may be formed on the entire surface of the substrate SUB to cover all of the display area AA, the non-display area NA, and the open hole area HLA. The organic film PCL is patterned so as not to be formed in the open hole area HLA. However, the present disclosure is not limited thereto and the organic film PCL may be patterned such that it extends up to the open hole area HLA but does not overlap the partition BH.

The inorganic films may not be separated by the partition BH. When the inorganic films PAS1 and PAS2 are formed to have excellent step coverage, the inorganic films PAS1 and PAS2 are formed along a tapered surface of the partition BH. Here, in the organic light emitting display device according to an embodiment of the present disclosure, the formation of the partition BH secures a long path of introduction of moisture and oxygen and/or long path of propagation of cracks through the inorganic films PAS1 and PAS2. Thus, in the organic light emitting display device according to an embodiment of the present disclosure, a time for moisture, oxygen, and cracks to be introduced to an internal element along the inorganic films PAS1 and PAS2 in an area adjacent to the open hole HL may be secured to be lengthened. The present disclosure may provide an organic light emitting display device with enhanced reliability and stability.

Hereinafter, another example of a stacked structure of the organic light emitting display device according to an embodiment of the present disclosure will be described with reference to FIG. 9. FIG. 9 is a cross-sectional view of the organic light emitting display device illustrated in FIG. 3, taken along line II-II', in which a stacked structure of the organic light emitting display device is illustrated. In describing another example of the stacked structure of the organic light emitting display device, the same contents as that of the descriptions of FIG. 7 may be omitted.

The organic light emitting display device according to an embodiment of the present disclosure may include a partition BH formed on a bank BN. The gate insulating film GI, the passivation film PAS, the planarization film PL, and the bank BN may be formed to extend to the open hole area HLA. The partition BH is formed on the bank BN. In order to separate layers formed to extend up to the open hole HL, the partition BH is formed to have a step higher than a height of the layers. For example, in order to separate each of the organic emission layer OL, the cathode electrode CAT, and the inorganic films PAS1 and PAS2 from corresponding layers outside the open hole area HLA, the partition BH is formed to be higher than a height of the stacked organic emission layer OL, the cathode electrode CAT, and the inorganic films PAS1 and PAS2. Accordingly, in the organic light emitting display device according to an embodiment of the present disclosure, introduction of moisture and oxygen and propagation of cracks along the organic emission layer OL, the cathode electrode CAT, and the inorganic films PAS1 and PAS2 in an area adjacent to the open hole HL may be blocked in advance, enhancing reliability and stability of the display device. Here, the partition BH may serve as a spacer. The spacer maintains a space such that a mask is not in direct contact with other stacked layer.

The organic light emitting display device according to an embodiment of the present disclosure may include both the partition BH structure illustrated in FIG. 7 and the partition BH structure illustrated in FIG. 9. That is, the partition BH illustrated in FIG. 7 may be formed in an area close to the open hole HL, and the partition BH illustrated in FIG. 9 may be formed in a region relatively distant from the open hole HL. Accordingly, in the organic light emitting display device according to an embodiment of the present disclosure, introduction of moisture and oxygen and/or propagation of cracks may be more effectively blocked.

Figure 10:
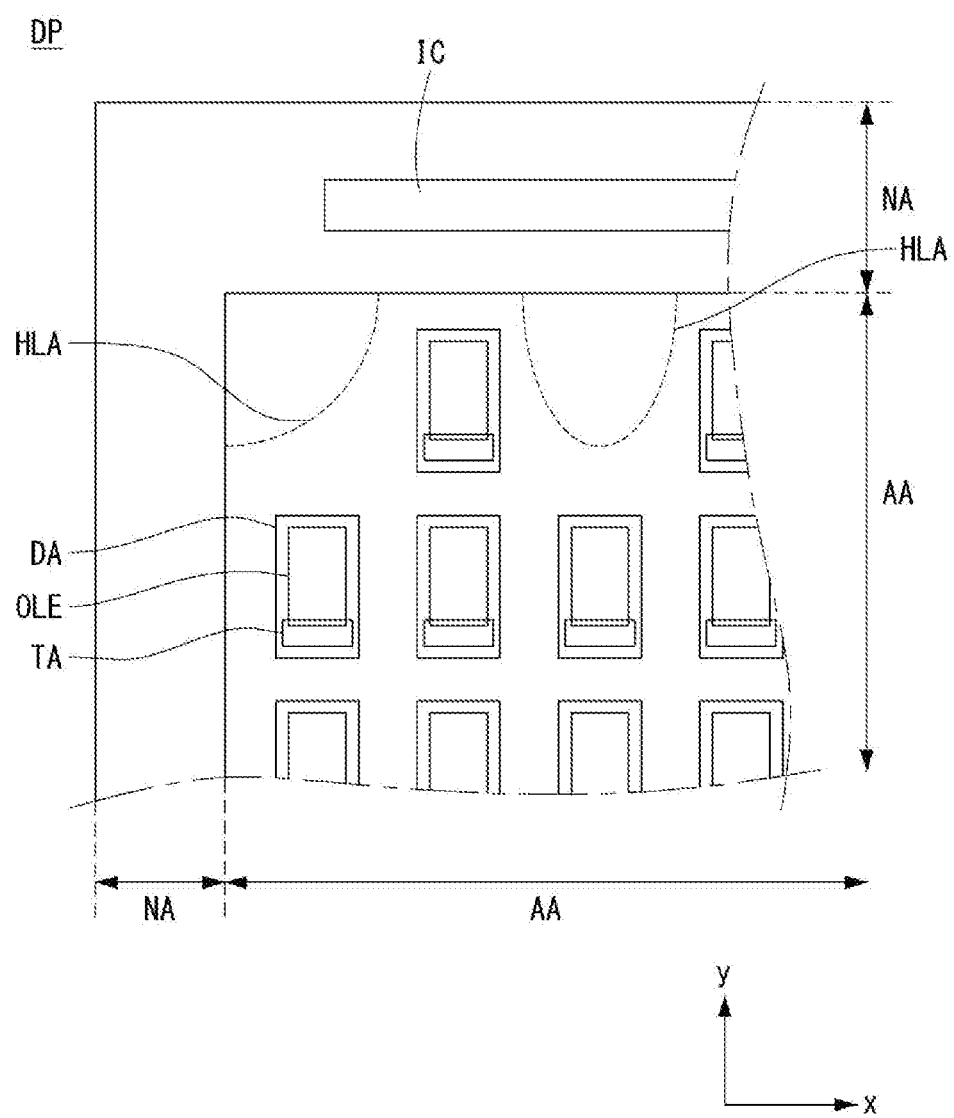
FIG. 10 is a view illustrating a position of an open hole area.
Figure 11:
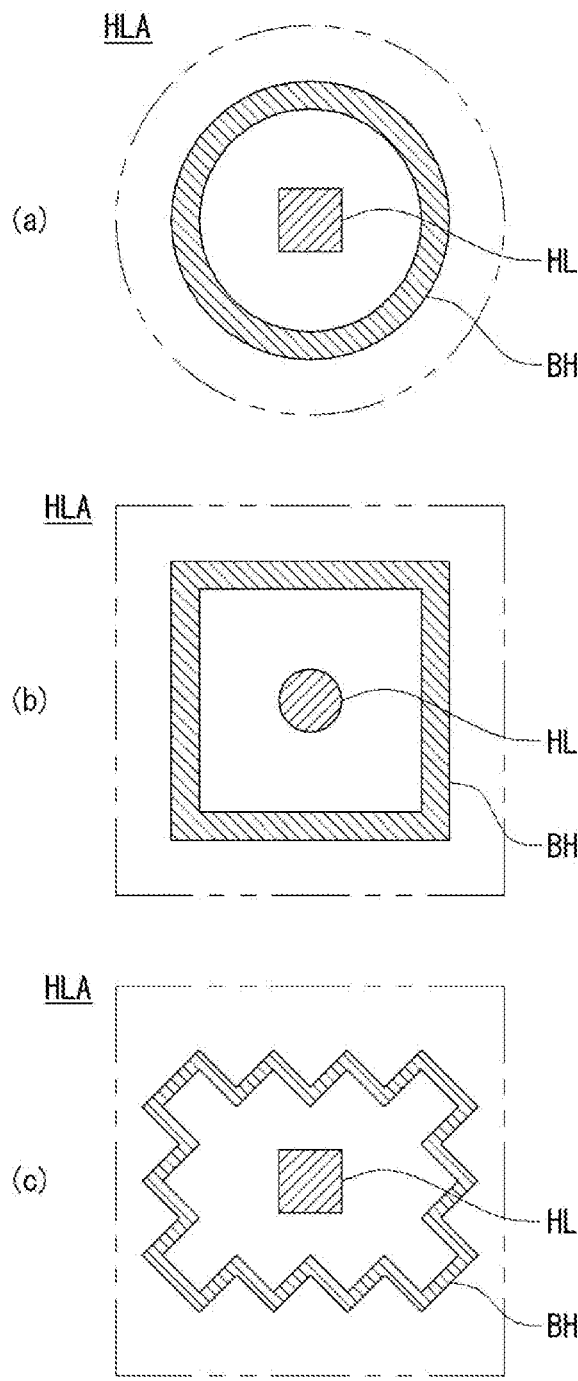
FIG. 11 is a view illustrating a planar shape of an open hole and a partition.
Figure 12:
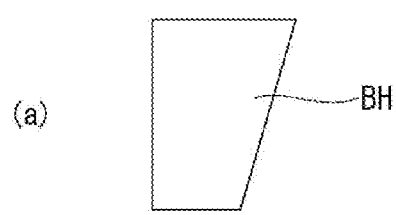
FIG. 12 is a view illustrating a lateral shape of a partition.
Figure 12:
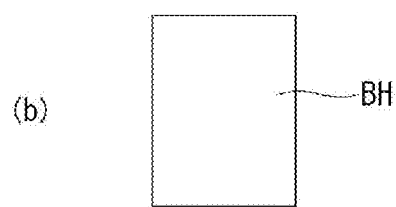
Figure 12:
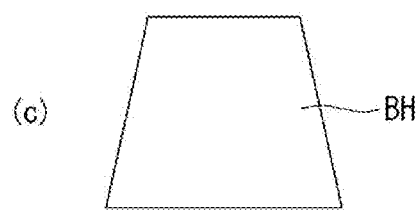

Hereinafter, examples of various formations of an open hole and a partition of the organic light emitting display device according to an embodiment of the present invention will be described with reference to FIGS. 10 to 12. FIG. 10 is a view illustrating a position of an open hole area. FIG. 11 is a view illustrating a planar shape of an open hole and a partition. FIG. 12 is a view illustrating various partition shapes having a lateral shape.

Referring to FIG. 10, the open hole area HLA may be defined in any one side portion of the display area AA, as well as in a central portion of the display area AA. That is, the open hole area HLA may be located in any position of the display area AA. Further, the partition BH provided in the open hole area HLA is disposed between adjacent pixels.

Referring to FIG. 11, the open hole area HLA includes at least one open hole HL and at least one partition BH. A planar shape of the open hole HL may be a planar figure shape including a circular shape and a polygonal shape. That is, the open hole HL may have various shapes according to a designer's need. As illustrated in FIG. 11(a), the planar figure shape of the open hole HL may be a polygonal shape and the planar shape of the partition BH may be a circular shape. As illustrated in FIG. 11(b), the planar figure shape of the open hole HL may be a circular shape and the planar shape of the partition BH may be a polygonal shape. Alternatively, as illustrated in FIG. 11(c), the planar figure shape of the open hole HL may be a polygonal shape and the planar shape of the partition BH may include various patterns such as a zigzag pattern, or the like. That is, the partition BH may have various shapes according to a designer's need.

Referring to FIG. 12, a lateral shape of the partition BH may have various shapes. A lateral shape of the partition BH may have an inversely tapered shape, that is, a trapezoid shape in which an upper side is longer than a lower side. As shown in FIG. 12(a), the lateral shape of the partition BH may be a trapezoid shape in which one side is vertical and the other side is sloped. As shown in FIG. 12(b), the lateral shape of the partition BH may be a rectangular or square shape. As shown in FIG. 12(c), the lateral shape of the partition BH may be a tapered shape. However, preferably, the partition BH has an inversely tapered shape in order to effectively separate the organic emission layer OL, the cathode electrode CAT, and the inorganic films PAS1 and PAS2 formed on the partition BH from the remaining organic emission layer OL, the cathode electrode CAT, and the inorganic films PAS1 and PAS2. The planar shape and the lateral shape of the partition BH may include any shape in which an introduction path of oxygen and moisture and propagation path of cracks are effectively blocked or the path is secured to be sufficiently long.

Figure 13:
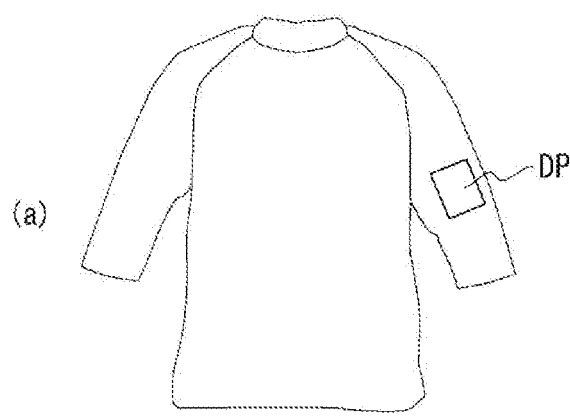
FIGS. 13 and 14 are views illustrating utilization examples according to an embodiment of the present invention.
Figure 13:
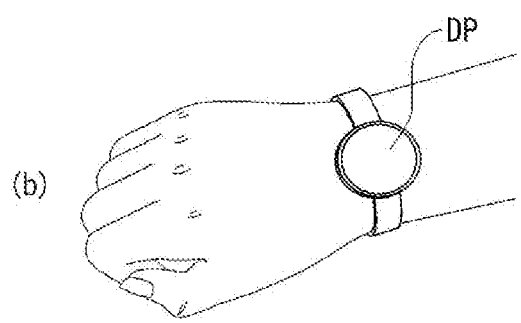
Figure 14:
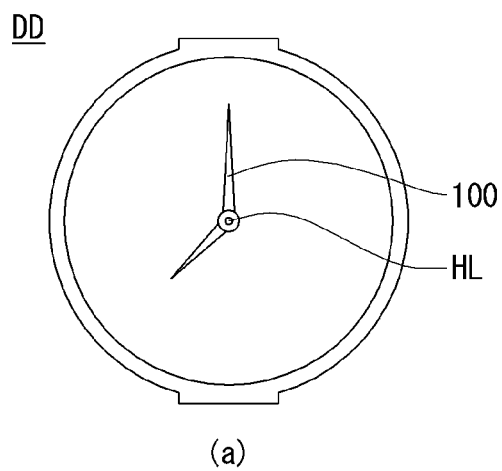
Figure 14:
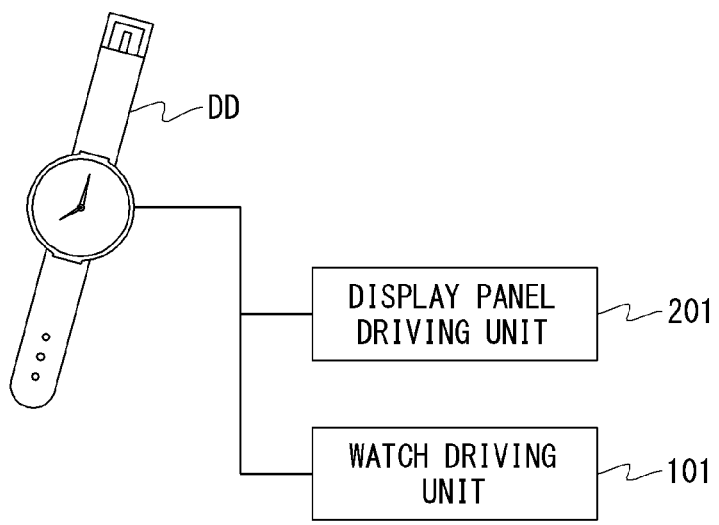

A utilization example of the organic light emitting display device according to an embodiment of the present disclosure will be described with reference to FIGS. 13 and 14. FIGS. 13 and 14 are views illustrating utilization examples according to embodiments of the present invention.

Research into a wearable type flexible display device DP which is worn on a user's body has been actively ongoing. For example, watch type and glass type flexible display devices DP have been attempted. In order to utilize such a flexible display device DP in various fields, an open hole HL provided in a display area may be required. For example, the flexible display device DP requires a fastening structure through which the flexible display device DP may be fixed to clothes of a user or a strap of a watch. FIG. 13(a) illustrates an example of a flexible display device DP fixed to an item of clothing. FIG. 13(b) illustrates an example of a flexible display device DP fixed to a strap of a watch. The fastening structure may be provided in a non-display area NA outside of a display area AA, but in terms of structural restrictions, due to the necessity in terms of design, or according to a user demand, the fastening structure may need to be provided in the display area AA. A technical concept of the present invention may be applied to various types of display devices in which an open hole HL is required to be provided in the display area AA.

Referring further to FIG. 14, an organic light emitting display device according to an embodiment of the present invention may be a watch type organic light emitting display device DD. The watch type organic light emitting display device DD according to an embodiment of the present invention includes a watchhand 100 provided on a front side of the organic light emitting display device DD and a watch driving unit 101 provided on a rear side of the organic light emitting display device DD. The watchhand 100 and the watch driving unit 101 are connected to each other through the open hole HL.

The watchhand 100 may include an hour hand, a minute hand, and a second hand rotating in relation to a central axis penetrating through the open hole HL. The watch driving unit 101 drives the watchhand 100. The watchhand 100 is driven in an analog manner by the watch driving unit 101. The watch driving unit 101 may use various schemes. For example, the watch type organic light emitting display device DD may be driven as a quartz movement type moved through a battery, a manual winding watch type using a clockwork, an automatic type in which movement of a clock housing is sensed, and a tourbillion type driven by calculating even an error of gravity.

The watch type organic light emitting display device DD includes a pixel driving unit 201 for driving pixels of an OLED and the watch driving unit 101 for driving the watch. The pixel driving unit 201 and the watch driving unit 101 may operate separately. The watch driving unit 101 and the pixel driving unit 201 may interwork with each other as necessary, but basically, they are discriminated and separately operate. Accordingly, when a preset event occurs, for example, when an event such as transmission/reception of a call, transmission/reception of a message, transmission/reception of information is performed through a wireless communication unit, or the like, each of the pixels is driven by the pixel driving unit 201. Apart from this, the watchhand 100 is constantly driven by the watch driving unit 101.

In the watch type organic light emitting display device DD configured as described above, there is no need to drive the pixels to check time. Thus, the watch type organic light emitting display device DD may reduce power consumption and is not required to perform an unnecessary operation to check time.

The organic light emitting display device according to an embodiment of the present invention may be utilized in various fields. When an open hole is required to be provided in a display area, the present invention may be applied to secure stability and reliability of a display device.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The present invention encompasses various modifications to each of the examples and embodiments discussed herein. According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

What is claimed is:

1. An organic light emitting display device comprising:
   a substrate having a display area in which a plurality of pixels are disposed, a non-display area outside of the display area, and at least one open hole area defined between the plurality of pixels; and
   a stacked layer structure disposed on the substrate and defining the plurality of pixels in the display area, the stacked layer structure including at least one organic layer,
   wherein the at least one open hole area comprises:
   at least one open hole penetrating through the substrate; and
   at least one partition disposed along a circumference of the at least one open hole between the at least one open hole and the plurality of pixel adjacent thereto to separate the at least one organic layer from a corresponding layer that extends to the at least one open hole.

2. The organic light emitting display device of claim 1, wherein the at least one partition includes a first partition and a second partition spaced apart from the first partition at a predetermined interval.

3. The organic light emitting display device of claim 1, wherein a lateral shape of the at least one partition is an inversely tapered shape.

4. The organic light emitting display device of claim 1, further comprising:
   a gate line and a data line disposed on the substrate and demarcating the plurality of pixels,
   wherein the gate line and the data line are disposed to bypass the at least one open hole.

5. The organic light emitting display device of claim 1, further comprising:
   a watchhand provided on a front side of the organic light emitting display device; and
   a watch driving unit provided on a rear side of the organic light emitting display device,
   wherein the watchhand and the watch driving unit are connected through the at least one open hole.

6. The organic light emitting display device of claim 5, further comprising:
   a pixel driving unit driving the plurality of pixels,
   wherein the watch driving unit and the pixel driving unit operate separately.

7. The organic light emitting display device of claim 6, wherein
   the watch driving unit is constantly driven, and
   the pixel driving unit is driven when a preset event occurs.

8. The organic light emitting display device of claim 1, wherein a planar shape of the at least one partition includes a circular shape or a polygonal shape.

9. The organic light emitting display device of claim 1, wherein a planar shape of the at least one open hole includes a circular shape or a polygonal shape.

10. The organic light emitting display device of claim 1, wherein the at least one partition is formed on the substrate to have a step higher than a height of the at least one organic layer in order to separate the at least one organic layer from a corresponding layer that extends to the at least one open hole.

11. The organic light emitting display device of claim 1, wherein the at least one organic layer is formed on a tapered surface of the at least one partition.

12. The organic light emitting display device of claim 1, wherein the at least one open hole area includes a bank formed on the substrate, wherein the at least one partition is formed on the bank.

13. An organic light emitting display device comprising:
    a substrate having a display area in which a plurality of pixels are disposed, a non-display area outside of the display area, and at least one open hole area defined between the plurality of pixels; and
    a stacked layer structure disposed on the substrate and defining the plurality of pixels in the display area, the stacked layer structure including at least one organic layer,
    wherein the at least one open hole area comprises:
    at least one open hole penetrating through the substrate; and
    a blocking pattern disposed along a circumference of the at least one open hole to block an introduction path of moisture and oxygen and a propagation path of cracks from spreading to the plurality of pixels adjacent to the at least one open hole by way of the at least one organic layer which extends to the at least one open hole, and
    wherein the blocking pattern separates the at least one organic layer from a corresponding layer that extends to the at least one open hole.

14. The organic light emitting display device of claim 13, wherein the at least one organic layer is separated from a corresponding layer that extends to the at least one open hole by the blocking pattern being formed on the substrate to have a step higher than a height of the at least one organic layer.

15. The organic light emitting display device of claim 13, wherein the blocking pattern separates the introduction path and separates the propagation path.

16. The organic light emitting display device of claim 15, further comprising:
    a process line provided on an upper portion of the blocking pattern,
    wherein the process line is a cut line formed to block the introduction path and the propagation path.

17. The organic light emitting display device of claim 13, wherein the blocking pattern lengthens the introduction path and the propagation path.

18. The organic light emitting display device of claim 13, wherein each of the plurality of pixels includes an organic light emitting diode and a thin film transistor,
    wherein the organic light emitting diode includes an anode electrode, a cathode electrode, and an organic emission layer interposed between the two electrodes, and wherein the organic emission layer is separated from a corresponding layer that extends to the at least one open hole by the blocking pattern.

19. The organic light emitting display device of claim 18, further comprising a passivation layer formed to cover the thin film transistor,
wherein the passivation layer has a stacked structure including one or more inorganic films and an organic film, and
wherein edges of the organic film are covered by an inorganic film of the one or more inorganic films.

20. The organic light emitting display device of claim 13,
wherein an organic light emitting diode and a thin film transistor are disposed in each of the plurality of pixels,
wherein the organic light emitting diode includes an anode electrode, a cathode electrode, and an organic emission layer interposed between the two electrodes, and
wherein the cathode electrode is separated from a corresponding layer that extends to the at least one open hole by the blocking pattern.

\* \* \* \* \*